United States Patent
Yamamoto et al.

(10) Patent No.: US 8,551,623 B2
(45) Date of Patent: Oct. 8, 2013

(54) AIRTIGHTLY SEALING CAP, ELECTRONIC COMPONENT STORING PACKAGE AND METHOD FOR MANUFACTURING ELECTRONIC COMPONENT STORING PACKAGE

(75) Inventors: Masaharu Yamamoto, Izumi (JP); Takayuki Furujo, Izumi (JP)

(73) Assignee: Neomax Materials Co., Ltd., Suita-shi (JP)

( * ) Notice: Subject to any disclaimer, the term of this patent is extended or adjusted under 35 U.S.C. 154(b) by 818 days.

(21) Appl. No.: 12/525,157

(22) PCT Filed: Feb. 19, 2008

(86) PCT No.: PCT/JP2008/052682
§ 371 (c)(1),
(2), (4) Date: Jul. 30, 2009

(87) PCT Pub. No.: WO2008/105258
PCT Pub. Date: Sep. 4, 2008

(65) Prior Publication Data
US 2010/0104887 A1      Apr. 29, 2010

(30) Foreign Application Priority Data
Feb. 26, 2007   (JP) .................. 2007-046243

(51) Int. Cl.
*B32B 15/01* (2006.01)
(52) U.S. Cl.
USPC ............... 428/672; 428/647; 428/680
(58) Field of Classification Search
None
See application file for complete search history.

(56) References Cited

U.S. PATENT DOCUMENTS

| | | | | |
|---|---|---|---|---|
| 3,480,412 A | * | 11/1969 | Duffek, Jr. et al. | 428/601 |
| 4,941,582 A | * | 7/1990 | Morikawa et al. | 220/2.1 R |
| 5,744,752 A | * | 4/1998 | McHerron et al. | 174/546 |
| 7,442,582 B2 | | 10/2008 | Reichert et al. | |
| 7,495,333 B2 | | 2/2009 | Miyazaki et al. | |
| 2006/0001172 A1 | | 1/2006 | Miyazaki et al. | |

FOREIGN PATENT DOCUMENTS

| | | |
|---|---|---|
| GB | 2343551 A | 5/2000 |
| JP | 8-168889 A | 7/1996 |
| JP | 2000-68396 A | 3/2000 |
| JP | 2001-510941 A | 8/2001 |
| JP | 2001-345394 A | 12/2001 |
| JP | 2002-009186 A | 1/2002 |
| JP | 2003-229504 A | 8/2003 |
| JP | 2005-353885 A | 12/2005 |
| JP | 2006-005262 A | 1/2006 |
| JP | 2006-294743 A | 10/2006 |

OTHER PUBLICATIONS

International Search Report issued in PCT/JP2008/052682, mailed on May 13, 2008.

\* cited by examiner

*Primary Examiner* — David Sample
*Assistant Examiner* — Adam Krupicka
(74) *Attorney, Agent, or Firm* — Westerman, Hattori, Daniels & Adrian, LLP

(57) ABSTRACT

Provided is an airtightly sealing cap, by which a use quantity of Au is reduced in a soldering material for sealing a miniaturized electronic component storing package. An airtightly sealing cap (10) is used for an electronic component storing package (100) which includes an electronic component storing member (20) for storing an electronic component (40). The airtightly sealing cap is provided with a base material (1); a base layer (2) which is formed on the surface of the base material and contains Ni; and a soldering material layer (6), which is formed on the base layer, has a thickness of 10 μm or less and composed of Au and Sn. The content percentage of Au in the soldering material layer is 43 mass % or more but not more than 64 mass %.

22 Claims, 5 Drawing Sheets

FIG.5

| | Au CONTENT BEFORE HEATING (mass%) | | TOTAL THICKNESS OF BRAZING FILLER METAL LAYER (μm) | | THICKNESS OF EACH LAYER (μm) | | THICKNESS RATIO (THICKNESS OF Au LAYER/THICKNESS OF Sn LAYER) | EVALUATION AFTER HEATING | | | | EVALUATION OF PKG SEALABILITY | |
|---|---|---|---|---|---|---|---|---|---|---|---|---|---|
| | | | | | | | | MELTING STARTING TEMPERATURE (°C) | | Au CONTENT | | WETT-ABILITY | 260°C HEAT RESISTANCE |
| | AVERAGE | RANGE | AVERAGE | RANGE | Au | Sn | | PRIMARY MELTING | SECONDARY MELTING | (mass%) | INCREASING RATIO (%) | | |
| COMPARATIVE EXAMPLE 1 | 18 | 16-21% | 6.0 | 5.4-6.6 | 0.5 | 5.5 | 0.09 | 219 | 417 | 28 | 56 | × | ○ |
| COMPARATIVE EXAMPLE 2 | 29 | 28-32% | 6.9 | 6.3-7.5 | 0.9 | 5.9 | 0.16 | 199 | 654 | 44 | 52 | × | ○ |
| COMPARATIVE EXAMPLE 3 | 41 | 40-43% | 6.6 | 5.9-7.2 | 1.4 | 5.2 | 0.27 | 221 | 316 | 60 | 46 | × | ○ |
| EXAMPLE 1 | 44 | 43-46% | 6.2 | 5.5-6.8 | 1.4 | 4.7 | 0.30 | 211 | 342 | 63 | 43 | △ | ○ |
| EXAMPLE 2 | 51 | 49-54% | 6.8 | 6.1-7.4 | 1.9 | 4.9 | 0.40 | 214 | 285 | 71 | 39 | ○ | ○ |
| EXAMPLE 3 | 55 | 54-57% | 7.0 | 6.4-7.6 | 2.2 | 4.8 | 0.45 | 200 | 282 | 73 | 32 | ○ | ○ |
| EXAMPLE 4 | 63 | 60-64% | 5.6 | 5.0-6.4 | 2.2 | 3.5 | 0.63 | 211 | 281 | 80 | 27 | △ | ○ |
| COMPARATIVE EXAMPLE 4 | 72 | 70-74% | 6.4 | 5.8-6.9 | 3.1 | 3.2 | 0.97 | 215 | 281 | 87 | 21 | × | ○ |
| COMPARATIVE EXAMPLE 5 | 79 | 78-81% | 6.4 | 5.8-7.1 | 3.8 | 2.6 | 1.46 | 204 | 280 | 89 | 13 | × | ○ |
| COMPARATIVE EXAMPLE 6 | 87 | 86-89% | 6.1 | 5.4-6.7 | 4.4 | 1.7 | 2.57 | 280 | 280 | 91 | 5 | × | ○ |

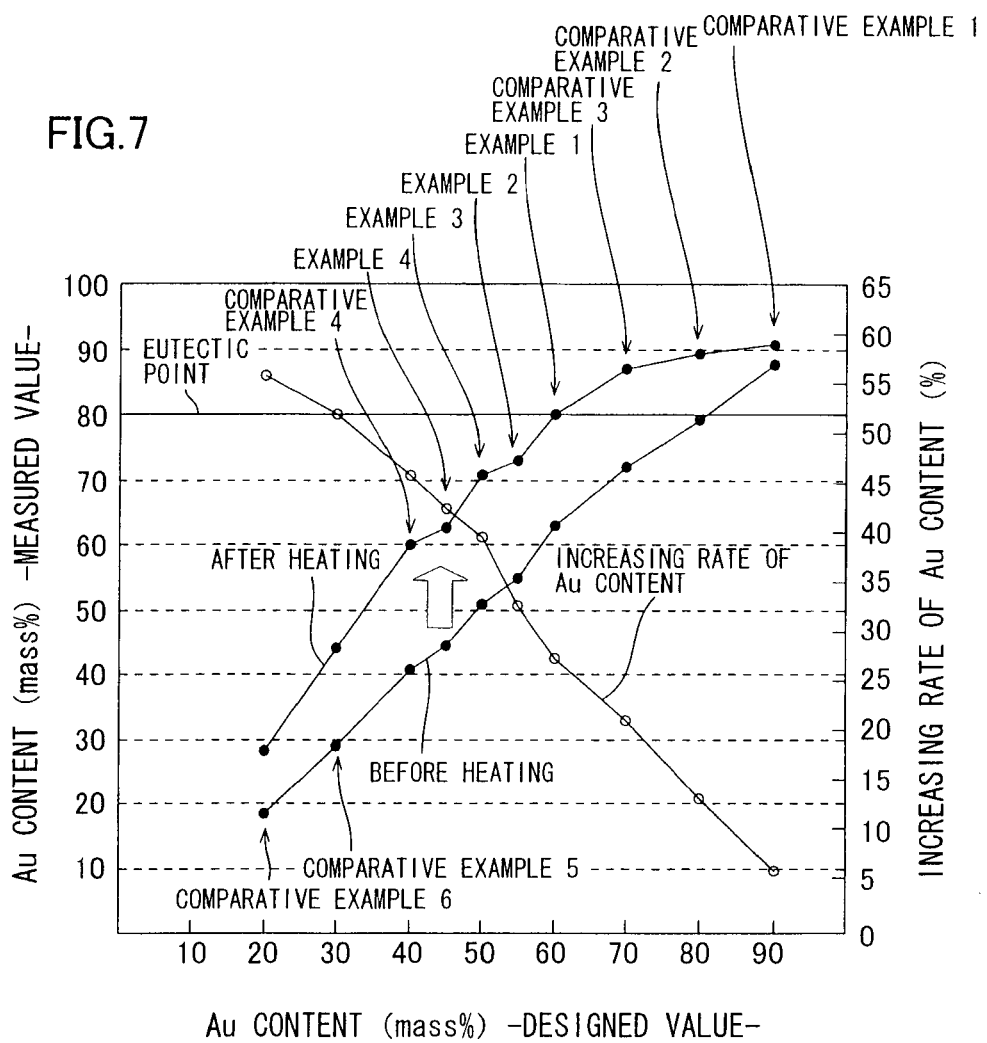

AIRTIGHTLY SEALING CAP, ELECTRONIC COMPONENT STORING PACKAGE AND METHOD FOR MANUFACTURING ELECTRONIC COMPONENT STORING PACKAGE

TECHNICAL FIELD

The present invention relates to an airtightly sealing cap, an electronic component storing package and a method for manufacturing an electronic component storing package, and more particularly, it relates to an airtightly sealing cap including a brazing filler metal layer composed of Au and Sn, an electronic component storing package sealed with the airtightly sealing cap and a method for manufacturing an electronic component storing package.

BACKGROUND ART

An airtightly sealing cap for sealing an electronic component storing package such as an SMD (Surface Mount Device) package (surface mount device package) employed for airtightly sealing an electronic component such as a SAW filter (surface acoustic wave filter) employed for noise reduction of a portable telephone or the like or a quartz resonator is known in general. An airtightly sealing cap including a brazing filler metal layer composed of Au and Sn is known as the airtightly sealing cap. Such an airtightly sealing cap is disclosed in each of Japanese Patent Laying-Open No. 2002-9186 and Japanese Patent Laying-Open No. 2000-68396, for example.

In relation to a brazing filler metal described in the aforementioned Japanese Patent Laying-Open No. 2002-9186, a brazing filler metal layer in which an Sn plating layer and an Au plating layer or an Au—Sn alloy plating layer are alternately stacked is so formed that the content of Au is 60 mass % to 85 mass %. This brazing filler metal described in Japanese Patent Laying-Open No. 2002-9186 conceivably has a thickness of at least 16 since an Au plating layer of 8 μm and an Sn plating layer of 8 μm are alternately stacked.

In relation to a brazing filler metal described in the aforementioned Japanese Patent Laying-Open No. 2000-68396, a brazing filler metal in which an Au layer and an Sn layer or an Sn-10% Au layer are so stacked that the content of Au is 63% to 81% in the brazing filler metal after heat treatment is disclosed.

Following miniaturization of a device (electronic component), an electronic component storing package storing the device and an airtightly sealing cap for sealing the electronic component storing package have also been miniaturized in recent years, and hence the quantity (thickness) of a brazing filler metal necessary for sufficiently bonding the electronic component storing package and the airtightly sealing cap to each other gets fewer (smaller).

In a brazing filler metal in which Au is employed similarly to the brazing filler metal described in each of the aforementioned Japanese Patent Laying-Open No. 2002-9186 and Japanese Patent Laying-Open No. 2000-68396, reduction of the usage of Au is demanded since Au is extremely high-priced.

However, the brazing filler metal described in the aforementioned Japanese Patent Laying-Open No. 2002-9186 has the thickness of at least 16 μm, and hence there is such a problem that the usage of Au increases as the brazing filler metal for sealing a miniaturized electronic component storing package.

In the aforementioned Japanese Patent Laying-Open No. 2000-68396, no specific structure such as the composition of the brazing filler metal before heat treatment (before sealing) is disclosed, and a technical idea of reducing the usage of Au in the brazing filler metal for sealing a miniaturized electronic component storing package is neither disclosed nor suggested.

DISCLOSURE OF THE INVENTION

The present invention has been proposed in order to solve the aforementioned problems, and an object of the present invention is to provide an airtightly sealing cap capable of reducing the usage of Au in a brazing filler metal for sealing a miniaturized electronic component storing package, an electronic component storing package sealed with the airtightly sealing cap and a method for manufacturing an electronic component storing package.

An airtightly sealing cap according to a first aspect of the present invention, which is an airtightly sealing cap employed for an electronic component storing package including an electronic component storing member for storing an electronic component, includes a base, an underlayer containing Ni formed on the surface of the base and a brazing filler metal layer composed of Au and Sn formed on the underlayer with a thickness of not more than 10 μm, while the content of Au in the brazing filler metal layer is at least 43 mass % and not more than 64 mass %.

In this airtightly sealing cap according to the first aspect, as hereinabove described, the brazing filler metal layer composed of Au and Sn having the thickness of not more than 10 μm is formed on the underlayer containing Ni, whereby the content of Au in the brazing filler metal layer (Au—Sn alloy layer having a bonding function) in sealing (after heating) can be remarkably increased with respect to the content of Au in the brazing filler metal layer before heating. In other words, when heating the brazing filler metal layer composed of Au and Sn, an Au—Sn alloy is formed, and Ni diffuses into the alloy layer from the underlayer. At this time, Ni and Sn are easier to bond than Ni and Au, and hence part of Sn in the Au—Sn alloy layer moves toward the underlayer containing Ni, and a diffusion layer mainly containing Ni—Sn is formed on the upper surface of the underlayer. Therefore, Sn in the brazing filler metal layer composed of Au and Sn so moves into the diffusion layer that the content of Sn in the Au—Sn alloy layer resulting from Au and Sn in the brazing filler metal layer decreases, whereby the content of Au in the Au—Sn alloy layer can be increased. Further, the brazing filler metal layer composed of Au and Sn before heating is so thinly formed in the present invention that the thickness thereof is not more than 10 μm, whereby the content of Au in the brazing filler metal layer (the Au—Sn alloy layer having the bonding function) in sealing (after heating) can be remarkably increased with respect to the content of Au in the brazing filler metal layer before heating, as compared with a case where the thickness of the brazing filler metal layer is large (larger than 10 μm). In other words, when the thickness of the brazing filler metal layer is small, the quantities of Au and Sn contained in the brazing filler metal layer also decrease as compared with the case where the thickness of the brazing filler metal layer is large, while the quantity of Sn forming the diffusion layer remains unchanged. When the thickness of the brazing filler metal layer is small, therefore, the ratio of the quantity of Sn forming the diffusion layer after heating in Sn contained in the brazing filler metal layer before heating (before sealing) remarkably increases as compared with the case where the thickness of the brazing filler metal layer is large, while the ratio (content) of Sn contained in the Au—Sn alloy layer after heating (after sealing) remarkably decreases. Therefore, the content of Au in the Au—Sn alloy layer can be remarkably increased with respect to the content of Au in the brazing filler metal layer before heating. Thus, when an alloy layer in which the content of Au is at a prescribed value is to be obtained as an alloy layer of Au—Sn after sealing, the content of Au in the brazing filler metal layer before sealing can be set to a value remarkably smaller than the aforementioned prescribed value. In the airtightly sealing cap according to the first aspect, therefore, the usage of Au in the brazing filler metal layer can be reduced while keeping sealability (wettability and heat resistance) of the brazing filler metal composed of Au and Sn.

In the airtightly sealing cap according to the first aspect, further, the content of Au in the brazing filler metal layer is so set to at least 43 mass % and not more than 64 mass % that the content of Au in the alloy layer of Au—Sn after heating can be set to at least 63 mass % and not more than 80 mass %. The alloy layer having such a content of Au is improved in performance as the brazing filler metal such as wettability and heat resistance. This effect has been verified by experimental results described later.

In the aforementioned airtightly sealing cap according to the first aspect, the thickness of the brazing filler metal layer may be not more than 7.6 μm.

In the aforementioned airtightly sealing cap according to the first aspect, the content of Au in the brazing filler metal layer is preferably at least 49 mass % and not more than 57 mass %. An Au—Sn alloy layer obtained by heating the brazing filler metal structured in this manner has excellent sealability further improved in wettability among Au—Sn alloy layers in the range (at least 43 mass % and not more than 64 mass %) of the content of Au in the aforementioned brazing filler metal layer.

In the aforementioned airtightly sealing cap according to the first aspect, the average of the content of Au in the brazing filler metal layer is preferably at least 44 mass % and not more than 63 mass %. According to this structure, the content of Au in the alloy layer of Au—Sn after sealing (after heating) can be set to at least 63 mass % and not more than 80 mass %.

In the aforementioned airtightly sealing cap according to the first aspect, the brazing filler metal layer is preferably formed by an Au layer and an Sn layer. According to this structure, the diffusion rate of Ni in the underlayer into Sn in the brazing filler metal layer can be increased as compared with a case of forming the brazing filler metal layer by an alloy layer made of an Au—Sn alloy, whereby the quantity of Sn in the diffusion layer can be increased. Thus, the quantity of Sn in the diffusion layer so further increases that the content of Au can be more increased in the alloy layer after sealing (after heating) with respect to the brazing filler metal layer before heating.

In this case, the thickness ratio of the Au layer to the Sn layer is preferably at least 0.30 and not more than 0.63. According to this structure, the content of Au in the alloy layer of Au—Sn after sealing (after heating) can be set to at least 63 mass % and not more than 80 mass %.

In the aforementioned structure in which the brazing filler metal layer is formed by the Au layer and the Sn layer, the Au layer and the Sn layer may include an Au plating layer and an Sn plating layer respectively.

In the aforementioned structure in which the brazing filler metal layer is formed by the Au layer and the Sn layer, the brazing filler metal layer may be formed by one Au layer and one Sn layer formed on the underlayer.

In this case, the Au layer is preferably formed on the surface of the underlayer, and the Sn layer is preferably formed on the surface of the Au layer. According to this structure, the brazing filler metal layer can be easily formed as compared with a case of forming the Au layer on the surface of the Sn layer.

An electronic component storing package according to a second aspect of the present invention includes an airtightly sealing cap including a base, an underlayer containing Ni formed on the surface of the base and a brazing filler metal layer composed of Au and Sn formed on the underlayer with a thickness of not more than 10 μm, in which the content of Au in the brazing filler metal layer is at least 43 mass % and not more than 64 mass %, and an electronic component storing member sealed with the airtightly sealing cap by brazing for storing an electronic component. According to this structure, an electronic component storing package in which the usage of Au is reduced can be obtained by sealing the electronic component storing member with the airtightly sealing cap according to the first aspect when the electronic component and the electronic component storing member are miniaturized.

In the aforementioned electronic component storing package according to the second aspect, the airtightly sealing cap sealing the electronic component storing member preferably includes a diffusion layer formed by diffusion of Ni in the underlayer into Sn in the brazing filler metal layer and a brazing alloy layer composed of an Au—Sn alloy formed on the surface of the diffusion layer. According to this structure, Sn in the brazing alloy layer so moves to the diffusion layer that the content of Au in the brazing alloy layer can be increased. Thus, when an alloy layer in which the content of Au is at a prescribed value is to be obtained as an alloy layer of Au—Sn after sealing, the content of Au in the brazing filler metal layer before sealing can be set to a value remarkably smaller than the aforementioned prescribed value. In the electronic component storing package according to the second aspect, therefore, an electronic component storing package in which the usage of Au is reduced can be obtained while keeping sealability (wettability and heat resistance) of the brazing filler metal composed of Au and Su with the airtightly sealing cap according to any of the aforementioned structures.

In this case, the content of Au contained in the brazing alloy layer is preferably at least 63 mass % and not more than 80 mass %. The electronic component storing member and the airtightly sealing cap can be excellently sealed with the brazing alloy layer having such a content of Au.

A method for manufacturing an electronic component storing package according to a third aspect of the present invention includes the steps of preparing an airtightly sealing cap including a base, an underlayer containing Ni formed on the surface of the base and a brazing filler metal layer composed of Au and Sn formed on the underlayer with a thickness of not more than 10 μm, in which the content of Au in the brazing filler metal layer is at least 43 mass % and not more than 64 mass %, and heating the airtightly sealing cap and an electronic component storing member storing an electronic component thereby sealing the electronic component storing member with the airtightly sealing cap by brazing.

In this method for manufacturing an electronic component storing package according to the third aspect, the airtightly sealing cap according to the first aspect and the electronic component storing member are so heated that the electronic component storing member can be sealed with the airtightly sealing cap by brazing. Thus, an electronic component storing package in which the usage of Au is reduced can be obtained when the electronic component and the electronic component storing member are miniaturized.

In the aforementioned method for manufacturing an electronic component storing package according to the third aspect, the airtightly sealing cap sealing the electronic component storing member preferably includes a diffusion layer formed by diffusion of Ni in the underlayer into Sn in the brazing filler metal layer and a brazing alloy layer composed of an Au—Sn alloy formed on the surface of the diffusion layer. According to this structure, Sn in the brazing alloy layer so moves to the diffusion layer that the content of Au in the brazing alloy layer can be increased. Thus, when an alloy layer in which the content of Au is at a prescribed value is to be obtained as an alloy layer of Au—Sn after sealing, the content of Au in the brazing filler metal layer before sealing can be set to a value remarkably smaller than the aforementioned prescribed value. In the electronic component storing package according to the second aspect, therefore, an electronic component storing package in which the usage of Au is reduced can be obtained while keeping sealability (wettability and heat resistance) of the brazing filler metal composed of Au and Su with the airtightly sealing cap according to any of the aforementioned structures.

In this case, the content of Au contained in the brazing alloy layer is preferably at least 63 mass % and not more than 80 mass %. The electronic component storing member and the airtightly sealing cap can be excellently sealed with the brazing alloy layer having such a content of Au.

In the aforementioned method for manufacturing an electronic component storing package according to the third aspect, the content of Au in the brazing filler metal layer is preferably at least 49 mass % and not more than 57 mass %. An Au—Sn alloy layer obtained by heating a brazing filler metal structured in this manner has excellent sealability further improved in wettability among Au—Sn alloy layers in the range (at least 43 mass % and not more than 64 mass %) of the content of Au in the aforementioned brazing filler metal layer.

In the aforementioned method for manufacturing an electronic component storing package according to the third aspect, the average of the content of Au in the brazing filler metal layer is preferably at least 44 mass % and not more than 63 mass %. According to this structure, the content of Au in the alloy layer of Au—Sn after sealing (after heating) can be set to at least 63 mass % and not more than 80 mass %.

In the aforementioned method for manufacturing an electronic component storing package according to the third aspect, the brazing filler metal layer is preferably formed by an Au layer and an Sn layer. According to this structure, the diffusion rate of Ni in the underlayer into Sn in the brazing filler metal layer can be increased as compared with a case of forming the brazing filler metal layer by an alloy layer made of an Au—Sn alloy, whereby the quantity of Sn in the diffusion layer can be increased. Thus, the quantity of Sn in the diffusion layer so further increases that the content of Au can be more increased in the alloy layer after sealing (after heating) with respect to the brazing filler metal layer before heating.

In this case, the thickness ratio of the Au layer to the Sn layer is preferably at least 0.30 and not more than 0.63. According to this structure, the content of Au in the alloy layer of Au—Sn after sealing (after heating) can be set to at least 63 mass % and not more than 80 mass %.

In the aforementioned structure in which the brazing filler metal layer is formed by the Au layer and the Sn layer, the Au layer and the Sn layer may include an Au plating layer and an Sn plating layer respectively.

BRIEF DESCRIPTION OF THE DRAWINGS

FIG. 5 A diagram for illustrating results of an experiment conducted for verifying effects of the present invention.

FIG. 7 A diagram for illustrating results of still another experiment conducted for verifying effects of the present invention.

BEST MODES FOR CARRYING OUT THE INVENTION

Figure 1:
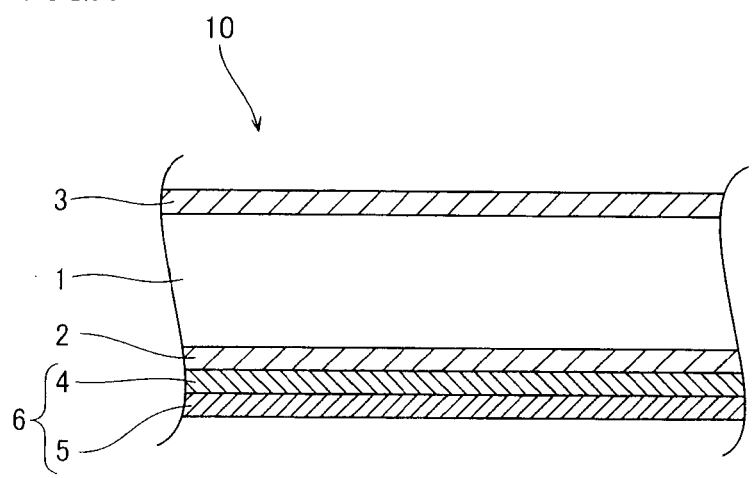
FIG. 1 A sectional view showing an airtightly sealing cap according to an embodiment of the present invention.

An embodiment of the present invention is now described with reference to the drawings.

First, the structure of an airtightly sealing cap 10 according to the embodiment of the present invention is described with reference to FIG. 1.

The airtightly sealing cap 10 according to this embodiment includes a base 1, Ni plating layers 2 and 3 formed on the surface and the back surface of the base 1 respectively, an Au plating layer 4 formed substantially on the overall surface of the Ni plating layer 2 and an Sn plating layer 5 formed substantially on the overall surface of the Au plating layer 4. A brazing filler metal layer 6 is constituted of the Au plating layer 4 and the Sn plating layer 5. The Ni plating layer 2, the Au plating layer 4 and the Sn plating layer 5 are examples of the "underlayer", the "Au layer" and the "Sn layer" in the present invention respectively.

The base 1 is composed of Kovar, and has a thickness of about 50 μm. The Ni plating layers 2 and 3 have thicknesses of about 1 μm. An Au plating layer (not shown) for preventing oxidation is thinly formed on the surface of the Ni plating layer 3.

According to this embodiment, the thickness of the brazing filler metal layer 6 formed by the Au plating layer 4 and the Sn plating layer 5 is set to not more than about 10 μm. In the brazing filler metal layer 6, the thickness ratio of the Au plating layer 4 to the Sn plating layer 5 is at least about 0.30 and not more than about 0.63. In the brazing filler metal layer 6, the content of Au is at least about 43 mass % and not more than about 64 mass %.

The structure of an electronic component storing member 20 sealed with the airtightly sealing cap 10 shown in FIG. 1 is described with reference to FIG. 2.

This electronic component storing member 20 includes a ceramic substrate 21 composed of an insulating material such as alumina and a plurality of ceramic frame bodies 22 composed of an insulating material such as alumina constituting storing spaces on a prescribed region of the surface of the ceramic substrate 22. The ceramic frame bodies 22 are so arranged as to partition the ceramic substrate 21 in the form of an array in plan view, and a plurality of electronic components 40 are mounted onto the ceramic substrate 21 through bumps 30 in the plurality of storing spaces surrounded by the ceramic frame bodies 22 respectively. For example, quartz resonators or SAW filters (surface acoustic wave filters) correspond to the electronic components 40. Tungsten layers 23, Ni—Co alloy layers 24 and Au layers 25 are formed on the upper surfaces of the ceramic frame bodies 22. These Au layers 25 are bonded to the brazing filler metal layer 6 of the airtightly sealing cap 10.

Figure 3:
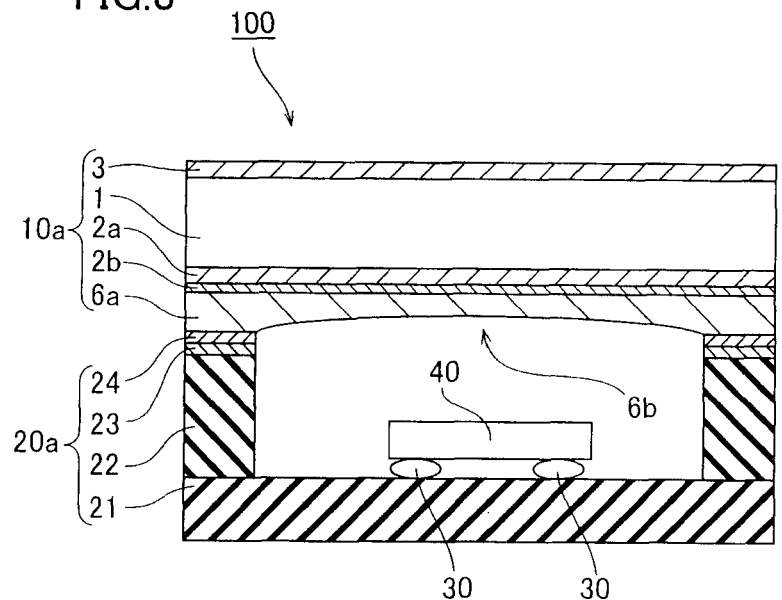
FIG. 3 A sectional view showing an electronic component storing package according to the embodiment of the present invention.

An electronic component storing package 100 according to this embodiment is now described with reference to FIG. 3.

The electronic component storing package 100 according to this embodiment has such a structure that the electronic component storing member 20 storing the aforementioned electronic components 40 is sealed with the aforementioned airtightly sealing cap 10 by brazing. The electronic component storing package 100 is relatively small-sized, and has a size of 1.2 mm by 1.4 mm in plan view, for example. In the state after the brazing sealing the electronic component storing member 20, the airtightly sealing cap 10 forms an airtightly sealing cap 10a having a structure different from that of the airtightly sealing cap 10 before sealing (before brazing) shown in FIG. 1.

The airtightly sealing cap 10a in this electronic component storing package 100 includes the base 1, Ni plating layers 2a and 3 formed on the surfaces of the base 1, an Ni diffusion layer 2b formed on the surface of the Ni plating layer 2a and an alloy layer 6a composed of an Au—Sn alloy formed on the surface of the Ni diffusion layer 2b. The Ni diffusion layer 2b is an example of the "diffusion layer" in the present invention.

The Ni plating layer 2a is an Ni plating layer remaining after Ni in the Ni plating layer 2 of the airtightly sealing cap 10 has been diffused toward the Au—Sn alloy layer 6a by heating. The Ni diffusion layer 2b, mainly composed of Sn—Ni, is formed by diffusion of Ni in the Ni plating layer 2 into Sn having moved toward the Ni plating layer 2a in Sn contained in the Au—Sn alloy layer 6a. The Au—Sn alloy layer 6a is mainly composed of a eutectic structure of Au—Sn, and has a melting point higher than 260° C. which is a mounting temperature for the electronic components 40. The content of Au in this Au—Sn alloy layer 6a is at least 63 mass % and not more than 80 mass %. An Au—Sn alloy having such a content of Au has a eutectic structure, and has excellent wettability. This Au—Sn alloy layer 6a is bonded to the Ni—Co alloy layers 24 of the electronic component storing member 20. Further, the Au—Sn alloy layer 6a has a concave shape in a central portion 6b (portion not bonded to the Ni—Co alloy layers 24 of the electronic component storing member 20). An electronic component storing member 20a in the electronic component storing package 100 has a structure similar to that of the aforementioned electronic component storing member 20, and hence redundant description is omitted.

A manufacturing process for the electronic component storing package according to this embodiment is now described with reference to FIGS. 1 to 4.

Figure 2:
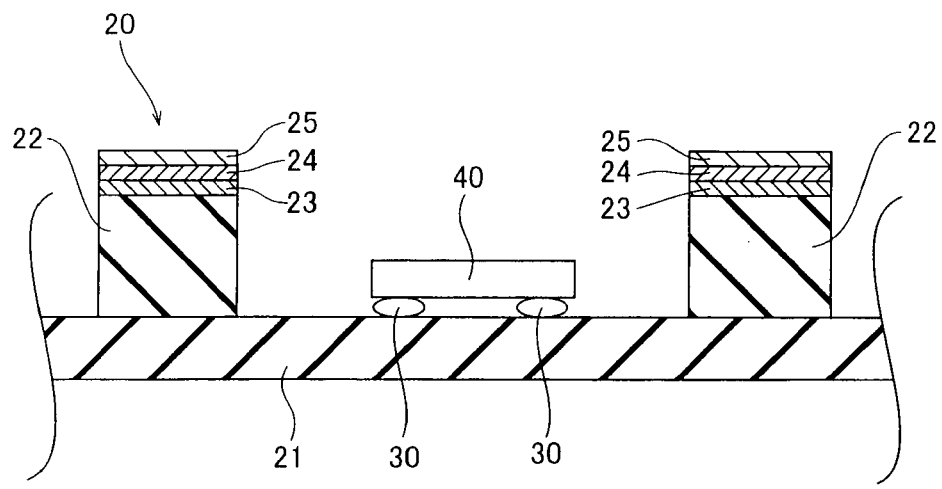
FIG. 2 A sectional view showing an electronic component storing member sealed with the airtightly sealing cap according to the embodiment of the present invention.
Figure 4:
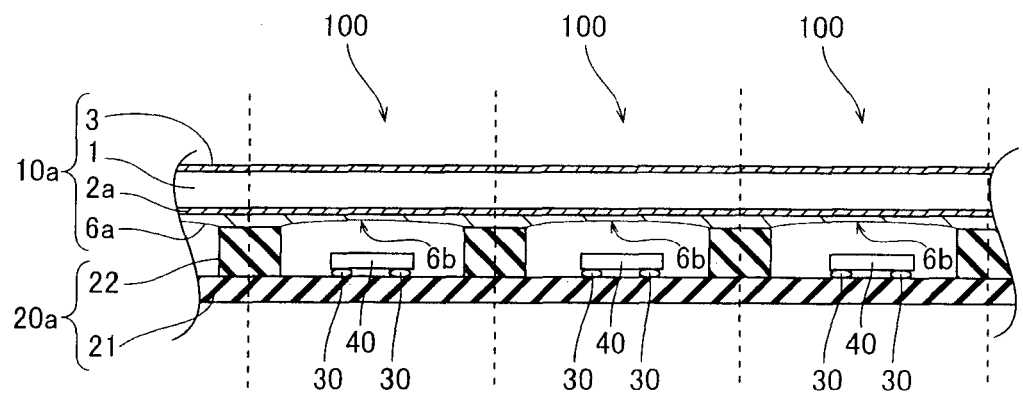
FIG. 4 A sectional view for illustrating a manufacturing process for the electronic component storing package shown in FIG. 3.

First, the side of the Sn plating layer 5 of the airtightly sealing cap 10 shown in FIG. 1 is arranged on the Au layers 25 of the electronic component storing member 20 shown in FIG. 2. Then, heating is performed in this state, thereby forming the Au—Sn alloy layer 6a by melting the brazing filler metal layer 6 formed by the Au plating layer 4 and the Sn plating layer 5 while welding the Au—Sn alloy layer 6a and the Ni—Co alloy layers 24 to each other, as shown in FIG. 4. Thus, the electronic components 40 in the plurality of storing spaces in the form of an array are sealed at once. At this time, Ni diffuses from the Ni plating layer 2 into the Au—Sn alloy layer 6a, whereby the Ni plating layer 2b and the Ni diffusion layer 2b composed of Sn—Ni are formed. Thus, the content of Au in the Au—Sn alloy layer 6a increases as compared with the content of Au in the brazing filler metal layer 6 before sealing. The concave central portion 6b is formed by movement of the Au—Sn alloy melted in sealing from the central portion to bonded portions. Thereafter dicing is performed with a diamond blade or the like, so that the substance is divided into each electronic component storing package 100. The electronic component storing package 100 according to this embodiment is formed in this manner.

According to this embodiment, as hereinabove described, the brazing filler metal layer 6 having the thickness of not more than 10 μm and consisting of the Au plating layer 4 and the Sn plating layer 5 is formed on the Ni plating layer 2, whereby the content of Au in the brazing filler metal layer (Au—Sn alloy layer having a bonding function) in sealing (after heating) can be remarkably increased with respect to the content of Au in the brazing filler metal layer before heating. Thus, when an alloy layer in which the content of Au is at a prescribed value (around 80 mass %) is to be obtained as the Au—Sn alloy layer 6a after sealing, the content of Au in the brazing filler metal layer 6 before sealing can be set to a value remarkably smaller than the aforementioned prescribed value. According to this embodiment, therefore, the usage of Au in the brazing filler metal layer 6 can be reduced. More specifically, the usage of Au can be reduced by 26 to 50%.

According to this embodiment, as hereinabove described, the content of Au in the brazing filler metal 6 is so set to at least 43 mass % and not more than 64 mass % that the content of Au in the Au—Sn alloy layer 6a of Au—Sn after heating can be set to at least 63 mass % and not more than 80 mass %. The Au—Sn alloy layer 6a having such a content of Au is improved in performance as the brazing filler metal such as wettability and heat resistance. This effect has been verified by the experimental results described later.

According to this embodiment, as hereinabove described, the thickness ratio of the Au layer to the Sn layer is so set to at least 0.30 and not more than 0.63 that the content of Au in the Au—Sn alloy layer 6a after sealing (after heating) can be set to at least 63 mass % and not more than 80 mass %.

EXAMPLES

Comparative experiments conducted for confirming effects of the airtightly sealing cap 10 according to the aforementioned embodiment are now described. First, a comparative experiment conducted by changing contents of Au by varying thickness ratios of Au plating layers 4 and Sn plating layers 5 in brazing filler metal layers 6 of airtightly sealing caps 10 and verifying sealability of these airtightly sealing caps 10 is described. In this comparative experiment, samples according to Examples 1 to 4 corresponding to this embodiment and samples according to comparative examples 1 to 6 were prepared.

The samples according to Examples 1 to 4 were so prepared that the contents of Au were 45 mass %, 50 mass % 55 mass % and 60 mass % as set values respectively. The samples according to comparative examples 1 to 6 were so set that the contents of Au were 20 mass %, 30 mass %, 40 mass %, 70 mass %, 80 mass % and 90 mass % as set values respectively. Further, these samples (Examples 1 to 4 and comparative examples 1 to 6) were so prepared that the thicknesses of the brazing filler metal layers 6 were about 7 μm as set values. Preparation conditions for the samples according to Examples 1 to 4 and the samples according to comparative examples 1 to 6 are identical to each other except a point that the same were prepared so that the contents of Au were different from each other.

As to these samples, thicknesses of the Au plating layers 4 and the Sn plating layers 5 were measured on a plurality of measuring points, as evaluation before heating. Further, the thicknesses (total thicknesses) of the brazing filler metal layers 6 formed by the Au plating layers 4 and the Sn plating layers 5 were measured. In addition, the contents of Au in the brazing filler metal layers 6 were calculated from the measured values of the thicknesses of the Au plating layers 4 and the Sn plating layers 5. Further, the thickness ratios of the Au plating layers 5 to the Sn plating layers 4 were calculated from the measured values of the thicknesses of the Au plating layers 4 and the Sn plating layers 5. FIG. 5 shows the results.

As to these samples, further, melting temperatures (primary melting temperatures) of the brazing filler metal layers 6 were measured on the assumption that electronic component storing members 20 were sealed with the airtightly sealing caps 10 at 300° C., as evaluation after heating. As to these samples after sealing, melting temperatures (secondary melting temperatures) of alloy layers 6a were measured on the assumption that electronic components 40 were mounted at 260° C. after sealing. Further, the contents of Au in the airtightly sealing caps 10 after primary melting were measured by an EDX (Energy Dispersive X-ray spectrometer). FIG. 5 shows the results as evaluation after heating.

As to these samples, electronic component storing members 20 in the form of arrays were sealed with those prepared by punching the respective samples into sizes of 50 mm by 50 mm, and thereafter diced into sizes of 1.4 mm by 1.2 mm. As to these samples after sealing, wettability was observed as evaluation of sealability of packages (PKGS). As to these samples after sealing, further, heat resistance was evaluated by heating the same to 260° C. which is the mounting temperature for the electronic components 40. FIG. 5 shows the results as PKG sealability evaluation.

As to wettability, wettability in a case of heating the PKGS and the airtightly sealing caps 10 in a nitrogen atmosphere of 300° C. for 15 minutes thereby sealing the same were evaluated with ○, x and Δ. ○ indicates those in which the Ni—Co alloy layers 24 of the electronic component storing members 20 are completely covered with the Au—Sn alloy layers 6a and fillet shapes of sections are smooth R shapes with no large recess portions. x indicates those in which the Au—Sn alloy layers 6a only partially cover the Ni—Co alloy layers 24 of the electronic component storing members 20 and irregularities are formed on the overall surfaces of fillet shapes of sections. Δ indicates those in which the Ni—Co alloy layers 24 of the electronic component storing members 20 are substantially completely covered with the Au—Sn alloy layers 6a while there are partially uncovered portions and most of fillet shapes of sections are smooth R shapes while recess portions are partially formed.

As to heat resistance, melting points (secondary melting temperatures) of the PKGS after the aforementioned sealing were measured by DATA (Differential thermal analysis), so that heat resistance was evaluated as ○ when the melting points were at least 260° C. and evaluated as x when the melting points were less than 260° C.

As shown in FIG. 5, the thicknesses of the brazing filler metal layers 6 were at least 5.0 μm and not more than 7.6 μm (at least 5.6 μm and not more than 7.0 μm on the average) in the samples prepared in practice, and the thicknesses of the brazing filler metal layers 6 of the samples according to Examples 1 to 4 were not more than 7.6 μm (not more than 7.0 μm on the average) in particular.

The thickness ratios of the Au plating layers 4 to the Sn plating layers 5 in Examples 1 to 4 were at least 0.30 and not more than 0.63, the thickness ratios in comparative examples 1 to 3 were not more than 0.27, and the thickness ratios in comparative examples 4 to 6 were at least 0.97.

The contents of Au in the brazing filler metal layers 6 (before heating) of Examples 1 to 4 were at least 43 mass % and not more than 64 mass % (at least 44 mass % and not more than 63 mass % on the average). The contents of Au in the brazing filler metal layers 6 (before heating) of comparative examples 1 to 3 were at least 16 mass % and not more than 43 mass % (at least 18 mass % and not more than 41 mass % on the average). The contents of Au in the brazing filler metal layers 6 (before heating) of comparative examples 4 to 6 were at least 70 mass % and not more than 89 mass % (at least 72 mass % and not more than 87 mass % on the average).

The primary melting temperatures in Examples 1 to 4 and comparative examples 1 to 5 were about 200° C. to 220° C., and the primary melting temperature in comparative example 6 was 280° C. The secondary melting temperatures in Examples 1 to 4 and comparative examples 1 to 5 were at least 280° C.

Figure 6:
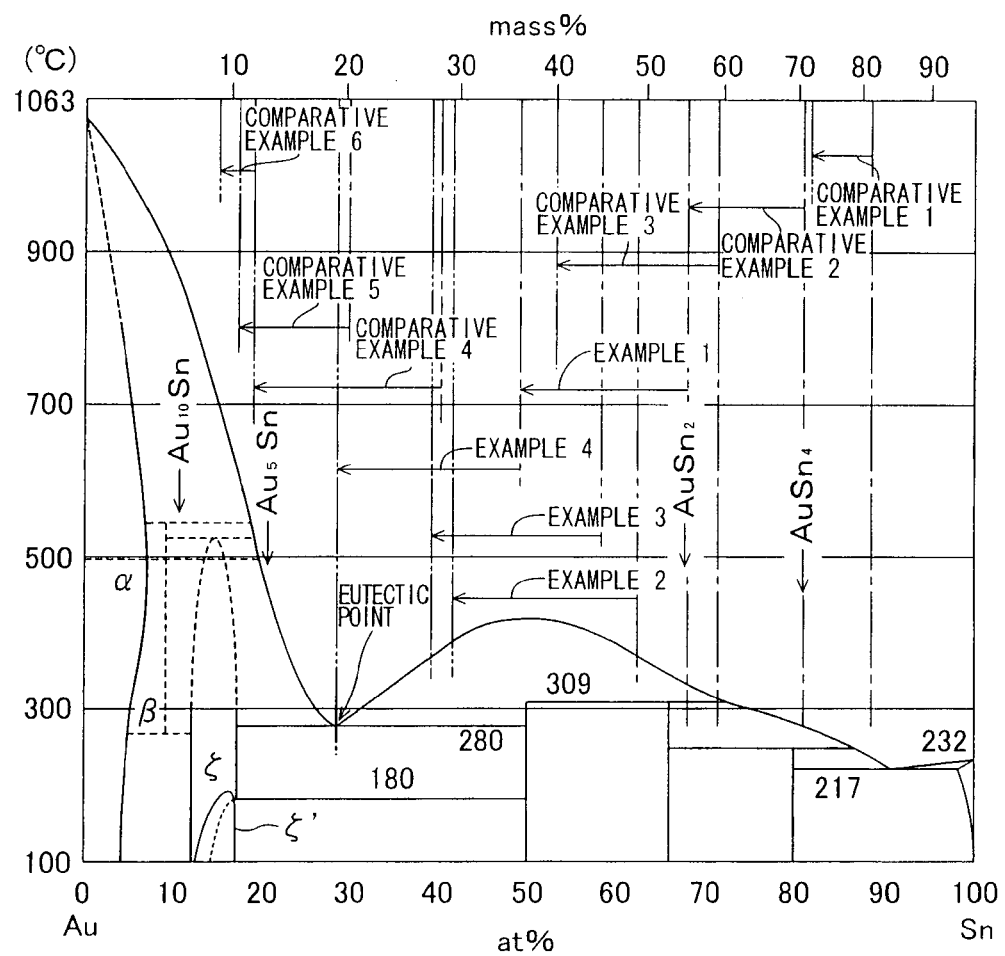
FIG. 6 A diagram for illustrating results of another experiment conducted for verifying effects of the present invention.

The contents of Au in the alloy layers 6a of Examples 1 to 4 after heating were at least 63 mass % and not more than 80 mass %, the contents of Au in comparative examples 1 to 3 were not more than 60 mass %, and the contents of Au in comparative examples 4 to 6 were at least 87 mass %. FIG. 6 shows the relation between the contents of Au in the brazing filler metal layers 6 before heating and the contents of Au in the alloy layers 6a after heating. FIG. 7 shows the increasing ratios of the contents of Au in the alloy layers 6a with respect to the contents of Au in the brazing filler metal layers 6.

First, it has been proven that the content of Au in the alloy layer 6a after heating (after primary melting) remarkably increases (27% to 43% in Examples 1 to 4) with respect to the content of Au in the brazing filler metal layer 6 before heating, as shown in FIGS. 5 and 7. This is conceivably for the following reason: That is, when heating the brazing filler metal layer 6 formed by the Au plating layer 4 and the Sn plating layer 5, the alloy layer 6a composed of Au—Sn is formed, while Ni diffuses into the alloy layer 6a from the Ni plating layer 2a. At this time, Ni and Sn are easier to bond than Ni and Au, and hence Sn in the alloy layer 6a moves toward the Ni plating layer 2a containing Ni, and the diffusion layer 2b mainly containing Ni—Sn is formed on the upper surface of the Ni plating layer 2a. Therefore, the quantity of Sn in the alloy layer 6a decreases due to the movement of Sn to the diffusion layer 2b, whereby the content of Au in the alloy layer 6a increases. The brazing filler metal layer 6 formed by the Au plating layer 4 and the Sn plating layer 5 before heating is thinly formed to be about 5 μm to about 7.6 μm in thickness in each Example, and hence the quantities of Au and Sn contained in the brazing filler metal layer 6 also decrease as compared with a case where the thickness of the brazing filler metal layer 6 is large, while the quantity of Sn forming the diffusion layer 2b remains unchanged. When the thickness of the brazing filler metal layer 6 is small (about 5 μm to about 7.6 μm) as in each Example, therefore, the ratio of the quantity of Sn forming the diffusion layer 2b after sealing (after heating) in Sn contained in the brazing filler metal layer 6 before sealing (before heating) remarkably increases while the ratio (content) of Sn contained in the Au—Sn alloy layer 6a after heating remarkably decreases as compared with the case where the thickness of the brazing filler metal layer is large (larger than 10 μm). Therefore, the content of Au in the Au—Sn alloy layer 6a after sealing (after heating) has conceivably remarkably increased with respect to the content of Au in the brazing filler metal layer 6 before heating.

Further, it has been proven that the increasing ratio of the content of Au increased as the content of Au in the brazing filler metal layer 6 decreased (the content of Sn increased), as shown in FIGS. 5 and 7. This is conceivably for the following reason: That is, the Ni diffusion layer 2b more easily grows as the quantity of Sn in the brazing filler metal layer 6 increases, and hence the increasing ratio of the content of Au in the alloy layer 6a conceivably increases due to the reduction of the quantity of Sn in the alloy layer 6a. When the thickness of the brazing filler metal layer 6 is larger than 10 μm, the ratio of Sn forming the Ni diffusion layer 2b decreases in Sn contained in the brazing filler metal layer 6, and hence a change width (reduction width) of the content of Sn in the Au—Sn alloy layer 6a after sealing (after heating) with respect to the content of Sn in the brazing filler metal layer 6 before sealing (before heating) decreases, while an increasing effect for the content of Au decreases.

The thickness of the brazing filler metal layer 6 must be at least 3 μm. According to the present invention, the diffusion layer 2b of at least 1 μm grows after heating due to Ni in the Ni plating layer 2a and Sn in the brazing filler metal layer 6. Therefore, normal bonding cannot be performed if the thickness of the brazing filler metal layer 6 is less than 3 μm.

As shown in FIG. 5, it has been proven that airtightness after sealing (after heating) is excellent and wettability is excellent in Examples 1 to 4. This is conceivably for the following reason: That is, while it is generally known that an Au—Sn alloy of a composition at a eutectic point (the content of Au is at least 80 mass %) has excellent wettability, the compositions after sealing (after heating) have compositions close to eutectic points in Examples 1 to 4, and hence Examples 1 to 4 conceivably have excellent wettability.

It has also been proven that, among Examples 1 to 4, particularly Examples 2 and 3 are superior in wettability as compared with Examples 1 to 4. Further, it has been proven that comparative examples 1 to 3 whose compositions after sealing (after heating) separated from eutectic points and comparative examples 4 to 5 whose compositions (contents of Au) after sealing (after heating) exceeded 80 mass % are inferior in wettability, as shown in FIG. 5. This is conceivably for the following reasons: That is, as to comparative examples 1 and 2, the contents of Sn were conceivably so large that the diffusion layers 2b advanced to the overall surfaces of the Au—Sn alloy layers 6a in sealing (in heating). As to comparative example 3, the melting point reaches 309° C. as shown in FIG. 6, and hence the same is not sufficiently melted at the sealing temperature (300° C.). As to comparative examples 4 to 6, wettability conceivably deteriorates since the gradients of liquidus curves abruptly increase when the contents of Au exceed 80 mass % and melting points increase while a compound $Au_5Sn$ is formed, as shown in FIG. 6. The wettability of the sample according to Example 4 is inferior as compared with Examples 2 and 3 conceivably because, while the content of Au in Example 4 after sealing (after heating) is 80 mass %, this value is the average of measured values on a plurality of points and hence there are portions exceeding 80 mass %.

All of secondary melting starting temperatures which are melting points of Examples 1 to 4 and comparative examples 1 to 6 after sealing are larger than 280° C., and hence airtightness can be conceivably kept without remelting in heating (260° C.) for mounting electronic components.

Also in examples prepared by punching the samples (airtightly sealing caps) according to Examples 1 to 4 and comparative examples 1 to 6 into sizes of 2.5 mm by 2.0 mm and sealing electronic component storing members similarly having sizes of 2.5 mm by 2.0 mm with the airtightly sealing caps dissimilarly to the aforementioned Examples prepared by collectively sealing the electronic component storing members in the form of arrays and thereafter dicing the same, results similar to those of the aforementioned Examples were attained.

The aforementioned results are conceivably influenced not only by the content of Au in the brazing filler metal layer 6 (thickness ratio of the Au plating layer 4 to the Sn plating layer 5) but also by the thickness of the brazing filler metal layer 6, and hence the content of Au (thickness ratio of the Au plating layer 4 to the Sn plating layer 5) responsive to the thickness of the brazing filler metal layer 6 must be studied.

The embodiment and Examples disclosed this time must be considered as illustrative in all points and not restrictive. The range of the present invention is shown not by the above description of the embodiment and Examples but by the scope of claims for patent, and all modifications within the meaning and range equivalent to the scope of claims for patent are included.

For example, while the example stacking the Au plating layer and the Sn plating layer as the Au layer and the Sn layer has been shown in the aforementioned embodiment, the present invention is not restricted to this, but the Au layer and the Sn layer may not be plating layers.

While the example stacking one Au plating layer and one Sn plating layer has been shown in the aforementioned embodiment, the present invention is not restricted to this, but a brazing filler metal layer having a thickness of not more than 10 μm may be formed by stacking Au plating layers and Sn plating layers in a multilayered manner.

While the example of forming the brazing filler metal layer by the Au plating layer and the Sn plating layer has been shown in the aforementioned embodiment, the present invention is not restricted to this, but the brazing filler metal layer may be formed by an Au—Sn alloy layer.

When an Au layer is formed on the upper surface of a tungsten layer of an electronic component storing member, or when an Au layer is formed on the upper surfaces of a tungsten layer and an Ni—Co layer, the content of Au in a brazing filler metal layer of an airtightly sealing cap may be decided in consideration of the quantity of Au in the Au layer. In this case, the Au layer on the electronic component storing member not only diffuses into the Au—Sn alloy layer but forms a metallized layer with the tungsten layer or the Ni—Co alloy layer, and hence this point must also be taken into consideration.

The invention claimed is:

1. An airtightly sealing cap (10) in an electronic component storing package (100) including an electronic component storing member (20) storing an electronic component (40), comprising:

a base (1);

an underlayer (2) containing Ni formed on the surface of said base; and a brazing filler metal layer (6) composed of Au and Sn formed on said underlayer with a thickness of not more than 10 μm, wherein the content of Au in said brazing filler metal layer is at least 43 mass % and not more than 64 mass %, said brazing filler metal layer is so formed as not to be bonded to said electronic component, but to be bonded to said electronic component storing member, said brazing filler metal layer is formed by an Au layer and an Sn layer, and a surface of said Sn layer which faces said electronic component storing member is exposed, and said brazing filler metal layer extends over said electronic component within the electronic component storing package.

2. The invention according to claim 1, wherein
the thickness of said brazing filler metal layer is not more than 7.6 μm.

3. The invention according to claim 1, wherein
the content of Au in said brazing filler metal layer is at least 49 mass % and not more than 57 mass %.

4. The invention according to claim 1, wherein
the average of the content of Au in said brazing filler metal layer is at least 44 mass % and not more than 63 mass %.

5. The invention according to claim 1, wherein
the thickness ratio of said Au layer to said Sn layer is at least 0.30 and not more than 0.63.

6. The invention according to claim 1, wherein
said Au layer and said Sn layer include an Au plating layer (4) and an Sn plating layer (5) respectively.

7. The invention according to claim 1, wherein
said brazing filler metal layer consists of one said Au layer and one said Sn layer formed on said underlayer.

8. The invention according to claim 7, wherein
said Au layer is formed on the surface of said underlayer, and
said Sn layer is formed on the surface of said Au layer.

9. The invention according to claim 1, wherein
said underlayer covers substantially an entire surface at a bonding side of said base; and
said brazing filler metal layer covers substantially an entire surface of said underlayer, including portions within said electronic component storing package extending over said electronic component within the electronic component storing package when said airtightly sealing cap is arranged on said electronic component storing package which is storing said electronic component.

10. An electronic component storing package (100) comprising:
an airtightly sealing cap (10) including a base (1), an underlayer (2) containing Ni formed on the surface of said base and a brazing filler metal layer (6) composed of Au and Sn formed on said underlayer with a thickness of not more than 10 μm, wherein the content of Au in said brazing filler metal layer is at least 43 mass % and not more than 64 mass %;
an electronic component storing member (20) sealed with said airtightly sealing cap by brazing for storing an electronic component (40);
an electronic component (40) sealed in said electronic component storing member by said brazing of said electronic component storing member with said airtightly sealing cap;
said brazing filler metal layer of said airtightly sealing cap is not bonded to said electronic component, but is bonded to said electronic component storing member;
said brazing filler metal layer is formed by an Au layer and an Sn layer, and a surface of said Sn layer which faces said electronic component storing member is exposed.

11. The electronic component storing package according to claim 10, wherein
said airtightly sealing cap sealing said electronic component storing member includes:
a diffusion layer (2b) formed by diffusion of Ni in said underlayer into Sn in said brazing filler metal layer, and
a brazing alloy layer (6a) composed of an Au-Sn alloy formed on the surface of said diffusion layer.

12. The electronic component storing package according to claim 11, wherein
said brazing alloy layer is formed such as to extend over said electronic component within the electronic component storing package; and
a central portion of said brazing alloy layer that extends over said electronic component within the electronic component storing package which is not bonded is formed to be concave.

13. The electronic component storing package according to claim 11, wherein
the content of Au contained in said brazing alloy layer is at least 63 mass % and not more than 80 mass %.

14. The electronic component storing package according to claim 10, wherein
said underlayer covers substantially an entire surface at a bonding side of said base; and
said brazing filler metal layer covers substantially an entire surface of said underlayer, including portions within said electronic component storing package extending over said electronic component within the electronic component storing package when said airtightly sealing cap is arranged on said electronic component storing package which is storing said electronic component.

15. A method for manufacturing an electronic component storing package, comprising the steps of:
preparing an airtightly sealing cap (10) including a base (1), an underlayer (2) containing Ni formed on the surface of said base and a brazing filler metal layer (6) composed of Au and Sn formed on said underlayer with a thickness of not more than 10 μm, wherein the content of Au in said brazing filler metal layer is at least 43 mass % and not more than 64 mass %; and
heating said airtightly sealing cap and an electronic component storing member (20) storing an electronic component (40), thus not bonding said brazing filler metal layer of said airtightly sealing cap to said electronic component, but bonding said brazing filler metal layer to said electronic component storing member, thereby sealing said electronic component storing member with said airtightly sealing cap by brazing; wherein
said brazing filler metal layer is formed by an Au layer and an Sn layer, and a surface of said Sn layer which faces said electronic component storing member is exposed.

16. The method for manufacturing an electronic component storing package according to claim 15, wherein
said airtightly sealing cap sealing said electronic component storing member includes:
a diffusion layer (2b) formed by diffusion of Ni in said underlayer into Sn in said brazing filler metal layer, and
a brazing alloy layer (6a) composed of an Au-Sn alloy formed on the surface of said diffusion layer.

17. The method for manufacturing an electronic component storing package according to claim 16, wherein
said brazing alloy layer is formed such as to extend over said electronic component within the electronic component storing package; and
a central portion of said brazing alloy layer that extends over said electronic component within the electronic component storing package which is not bonded is formed to be concave.

18. The method for manufacturing an electronic component storing package according to claim 16, wherein the content of Au in a brazing alloy layer after heating is increased to between 63 mass % to 80 mass %.

19. The method for manufacturing an electronic component storing package according to claim 16, wherein the content of Au in a brazing alloy layer after heating is increased by between 27% to 43% with respect to the content of Au in the brazing filler metal layer before heating.

20. The method for manufacturing an electronic component storing package according to claim 16, wherein during heating the quantity of Sn in a brazing alloy layer decreases due to movement of Sn to a diffusion layer such that the content of Au increases.

21. The method for manufacturing an electronic component storing package according to claim 16, wherein
the content of Au contained in said brazing alloy layer is at least 63 mass % and not more than 80 mass %.

22. The method for manufacturing an electronic component storing package according to claim 15, wherein
said underlayer covers substantially an entire surface at a bonding side of said base; and
said brazing filer metal layer covers substantially an entire surface of said underlayer, including portions within an electronic component storing package extending over an electronic component within the electronic component storing package when said airtightly sealing cap is arranged on said electronic component storing package which is storing said electronic component.

* * * * *